(12) United States Patent
Chen et al.

(10) Patent No.: US 11,869,822 B2
(45) Date of Patent: Jan. 9, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chih-Hao Chen, Taipei (TW); Po-Yuan Cheng, Hsinchu (TW); Pu Wang, Hsinchu (TW); Li-Hui Cheng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/383,449

(22) Filed: Jul. 23, 2021

(65) Prior Publication Data
US 2023/0026141 A1   Jan. 26, 2023

(51) Int. Cl.
*H01L 23/31* (2006.01)
*H01L 25/065* (2023.01)
*H01L 23/00* (2006.01)
*H01L 25/00* (2006.01)

(52) U.S. Cl.
CPC .......... *H01L 23/3157* (2013.01); *H01L 24/16* (2013.01); *H01L 24/32* (2013.01); *H01L 24/73* (2013.01); *H01L 25/0655* (2013.01); *H01L 25/50* (2013.01); *H01L 2224/16227* (2013.01); *H01L 2224/32225* (2013.01); *H01L 2224/73204* (2013.01)

(58) Field of Classification Search
CPC ..... H01L 23/3157; H01L 24/16; H01L 24/32; H01L 25/50
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

(Continued)

*Primary Examiner* — Errol V Fernandes
(74) *Attorney, Agent, or Firm* — JCIPRNET

(57) ABSTRACT

A semiconductor package includes a redistribution structure, a plurality of semiconductor devices, and a plurality of heat dissipation films. The plurality of semiconductor devices mounted on the redistribution structure. The plurality of heat dissipation films are respectively disposed on and jointly covering upper surfaces of the plurality of semiconductor devices. A plurality of trenches are respectively extended between each two of the plurality of heat dissipations and extended between each two of the plurality of semiconductor devices.

20 Claims, 13 Drawing Sheets

(56) References Cited

U.S. PATENT DOCUMENTS

2019/0348343 A1* 11/2019 Kwon ............... H01L 24/17
2020/0219786 A1*  7/2020 Hung ............... H01L 23/3185
2020/0411411 A1* 12/2020 Hoffmeyer ......... H01L 23/3675

* cited by examiner

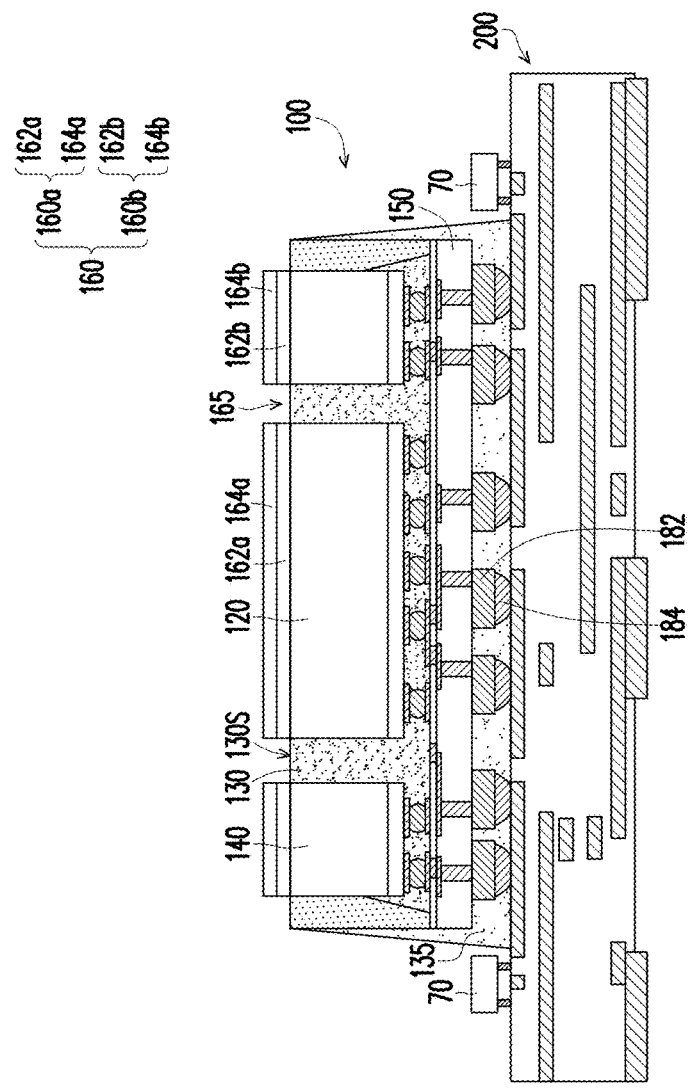
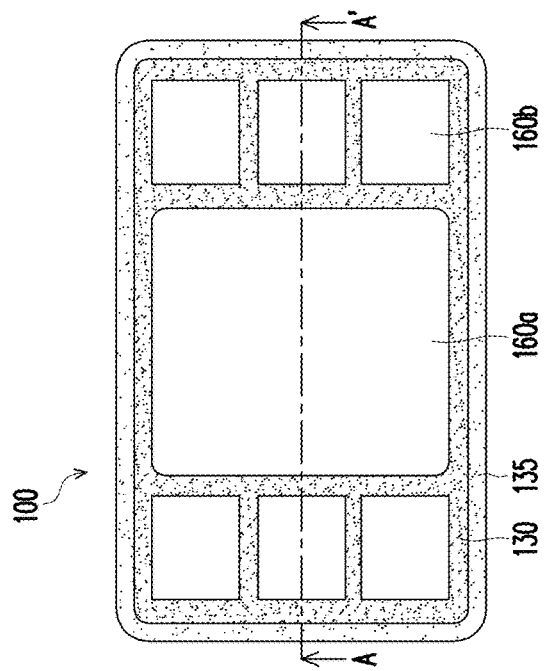
FIG. 9B
FIG. 9A

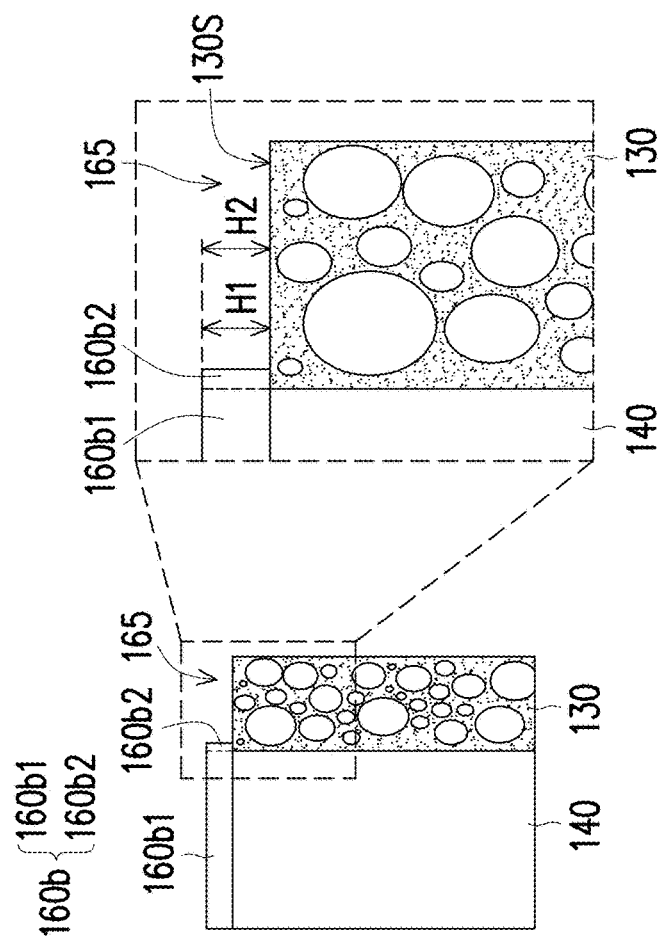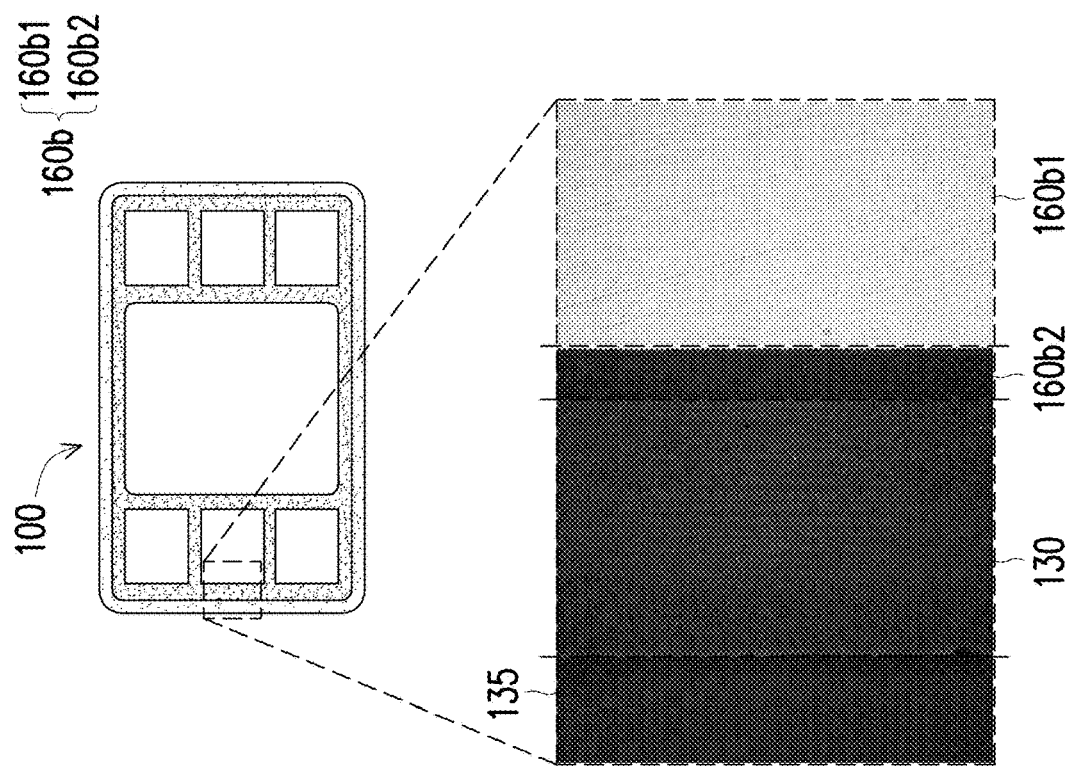
FIG. 10A
FIG. 10B

SEMICONDUCTOR PACKAGE AND MANUFACTURING METHOD THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers and conductive layers over a semiconductor substrate, and patterning the various material layers using lithography to form circuit components and elements thereon.

In an attempt to further increase circuit density, three-dimensional (3D) ICs have been investigated. In a typical formation process of a 3D IC, semiconductor dies are bonded together and electrical connections are formed between each semiconductor die and contact pads on a substrate. Interposer stacking is part of 3D IC technology, where a Through-Silicon-Via (TSV) embedded interposer is connected to a device silicon with a micro bump. In a chip-on-wafer-on-substrate (CoWoS) process flow, a device silicon chip is first attached onto a silicon interposer wafer, which is then diced. The resulting stacked silicon is then attached onto a substrate to form a 3D semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9A illustrates a top view of a die package according to some exemplary embodiments of the present disclosure.

FIG. 9B illustrates a cross section view of the die package along an AA' line of FIG. 9A.

FIG. 10A and FIG. 10B illustrate an enlarge view of a die package according to some exemplary embodiments of the present disclosure.

DETAILED DESCRIPTION

Figure 1:
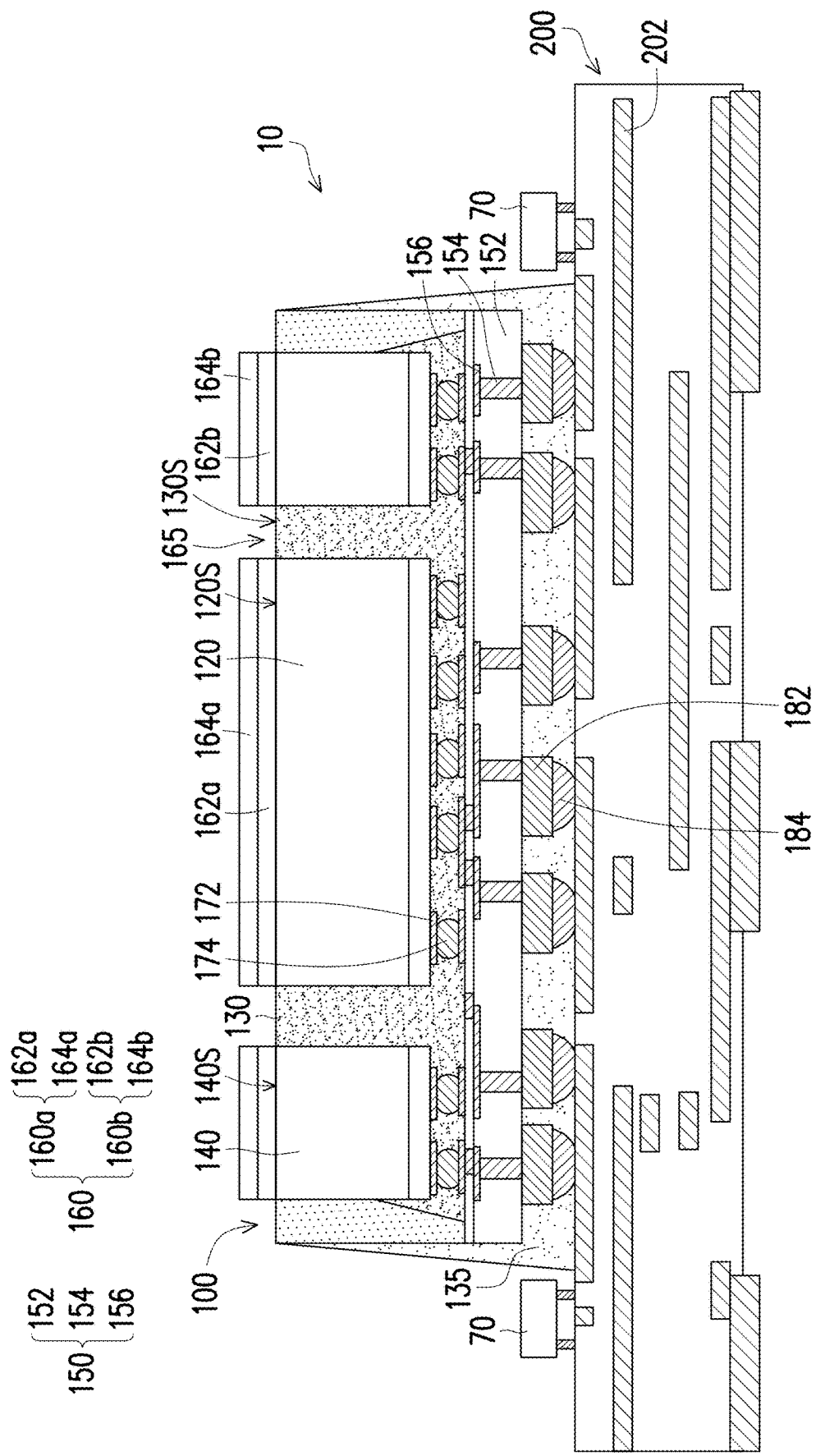
FIG. 1 illustrates a cross sectional view of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, manufacturing processes may include forming multi-chip package structures using Chip-on-Wafer-on-Substrate (CoWoS) packaging processing. Other embodiments may also using other processing, including integrated fan-out (InFO) packaging processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 illustrates a cross sectional view of a semiconductor package 10 according to some exemplary embodiments of the present disclosure. Referring to FIG. 1, in the current embodiment, the semiconductor package 100 includes a redistribution structure 150, a plurality of semiconductor devices 120, 140, and a plurality of heat dissipation films 160a, 160b. The plurality of semiconductor devices 120, 140 are mounted on the redistribution structure 150. The heat dissipation films 160a, 160b are respectively disposed on and jointly covering upper surfaces 120S, 140S of the semiconductor devices 120, 140. Moreover, a plurality of trenches 165 are respectively extended between each two of the heat dissipation films 160a, 160b and respectively extended between each two of the semiconductor devices 120, 140. In some embodiments, the semiconductor devices 120, 140 are, for example, a plurality of semiconductor dies. In some embodiments, both the semiconductor devices 120 and 140 are included in a single die package 100.

Referring again to FIG. 1, in the present embodiment, the semiconductor package can further include an encapsulating material 130 disposed on the redistribution structure 150. The encapsulating material 130 encapsulates and surrounds both the semiconductor devices 120, 140. As shown in FIG. 1, a top surface 130S of the encapsulating material 130 is exposed from the trenches 165 respectively between the heat dissipation films 160a, 160b and respectively between the semiconductor devices 120, 140. In addition, as shown in FIG. 1, the top surface of the encapsulating material 130 may be also exposed from peripheral edges of the die package 100. In some embodiments, the encapsulating material 130 may be an epoxy resin molding material.

Referring again to FIG. 1, as described, the semiconductor devices 120, 140 may be semiconductor dies which have the heat dissipation films 160a, 160b disposed on the upper surfaces 120S, 140S (back sides) thereof. As shown in FIG. 1, the heat dissipation films 160a, 160b are isolated from each other through the trenches 165 formed and extended therebetween. As illustrated in FIG. 1, the heat dissipation film 160a covering the semiconductor device 120 and the heat dissipation film 160b covering the semiconductor device 140 are unconnected with each other. In the present embodiment, the heat dissipation films 160a, 160b are respectively formed in a plurality of small pieces merely on the upper surfaces 120S, 140S of the semiconductor devices 120, 140, instead of being formed together as a continuous structure covering entire upper surface of the die package 100 including the upper surfaces 120S, 140S of the semiconductor devices 120, 140 and the top surface 130S of the encapsulating material 130. In some embodiments, a covering area of the heat dissipation film 160a, covering the semiconductor device 120, is greater than a covering area of each of the heat dissipation films 160b, respectively covering the semiconductor devices 140.

In the present embodiment, through the above configurations of the heat dissipation films 160a, 160b, a stronger attachment between the heat dissipation films 160a, 160b and the semiconductor devices 120, 140 can be achieved comparing to disposition of a single continuous heat dissipation structure on the die package 100 due to a weaker attachment between the heat dissipation structure and the encapsulating material 130. That is, an interface between the heat dissipation structure and the semiconductor devices 120, 140 formed by, for example, a silicon material or related alloy materials, can have a stronger attachment that than an interface between the heat dissipation structure and the encapsulating material 140 formed by, for example, an epoxy molding compound material, which may cause delamination of heat dissipation structure due to attachment force difference between the two interfaces. Hence, through the above configuration of the heat dissipation films 160a and 160b, delamination between the heat dissipation films 160a, 160b and the semiconductor devices 120, 140 due to a warpage of the die package 100 and the overall semiconductor package 10 generated during manufacturing processes thereof can be alleviated or avoided.

In some embodiments, the heat dissipation film 160a includes a first heat dissipation layer 162a and a second heat dissipation layer 164a alternatively and vertically stacked on the upper surface 120S of the semiconductor device 120. In some embodiments, the first heat dissipation layer 162a and the second heat dissipation layer 164a can include metal materials such as aluminum (Al), titanium (Ti), titanium nitride (TiN), nickel (Ni), nickel vanadium (NiV), gold (Au), Silver (Ag), or the combinations thereof. In some embodiments, a thickness of the first heat dissipation layer 162a may be different a thickness of the second heat dissipation layer 164a. Further, each of the heat dissipation films 160b includes a first heat dissipation layer 162b and a second heat dissipation layer 164b alternatively and vertically stacked on each of the upper surface 140S of the semiconductor devices 140. In the present embodiment, the first heat dissipation layer 162b and the second heat dissipation layer 164b may have similar configurations as the first heat dissipation layer 162a and the second dissipation layer 164a in their composing materials and thicknesses. In the present embodiment, numbers of heat dissipation layers of the heat dissipation films 160a, 160b are not limited to the above exemplified embodiments and may be adjusted depending on practical needs.

In some embodiments, the redistribution structure 150 may be an interposer, which includes a substrate 152, a plurality of through vias 154, and conductive pads 156. In some embodiments, the substrate 152 may comprise a bulk semiconductor substrate, a silicon on insulator (SOI) substrate or a multi-layered semiconductor material substrate. The semiconductor material of the substrate 152 may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the substrate 152 may be doped or undoped. In some embodiments, the through vias 154 are formed in the substrate 152 and connected with the conductive pads 156. In some embodiments, the through vias 154 extend into the substrate 152 with a specific depth. In some embodiments, the through vias 154 are through-substrate vias. In some embodiments, the through vias 154 are through-silicon vias when the substrate 152 is a silicon substrate. In some embodiments, the through vias 154 may be formed by forming holes or recesses in the substrate 152 and then filling the recesses with a conductive material. In some embodiments, the recesses may be formed by, for example, etching, milling, laser drilling or the like. In some embodiments, the conductive material fulling in the through holes 154 may be formed by an electro-chemical plating process, a chemical vapor deposition (CVD), an atomic layer deposition (ALD) or a physical vapor deposition (PVD), and the conductive material may include copper (Cu), tungsten (W), Al, Ag, Au or a combination thereof.

In some other embodiments, the redistribution structure 150 can be a redistribution circuit layers for an InFO package, and can be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the semiconductor devices (e.g., semiconductor devices 120, 140) disposed thereon.

In some embodiments, a plurality of conductive pads 172 and a plurality of conductive joints 174, connected to the conductive pads 172 disposed thereabove and therebelow, are respectively disposed between the semiconductor devices 120, 140 and the redistribution structure 150. Referring to FIG. 1, the conductive joints 174 are respectively surrounded by the encapsulating material 130. In the present embodiment, throughout the above descriptions, a package including the semiconductor devices 120, 140, the redistribution structure 150, the encapsulating material 130, the conductive joints 174, and the conductive pads 172, as shown in FIG. 1, is referred to as the die package 100. In some embodiments, the conductive joints 174 are micro-bumps, such as micro-bumps having copper metal pillars. In some other embodiments, the conductive joints 174 are solder bumps, lead-free solder bumps, or micro bumps, such as controlled collapse chip connection (C4) bumps or micro bumps containing copper pillars. Referring to again FIG. 1, the conductive joints 174 electrically connect the semiconductor devices 120, 140 and the redistribution structure 150 through the conductive pads 172.

In some embodiments, the semiconductor package 10 can further include a substrate 200, and the die package 100 is mounted on the substrate 200. In some embodiments, the substrate 200 may be placed on a substrate fixture (not shown) mounted on a platform. The substrate fixture may be a plate fixture having more than one fixture units. In some embodiments, the substrate 200 can include a build-up substrate, a laminate substrate, a circuit board such as a printed circuit board (PCB), or the like. In some embodiments, a plurality of conductive pads 182 and a plurality of electronic connectors 184 respectively connected thereto are disposed between the die package 100 and the substrate 200. With reference to FIG. 1, the substrate 200 may include a plurality of conductive traces 202 therein, and the electrical connectors 184 are respectively connected to the conductive traces 202. Moreover, with reference to FIG. 1, passive components 70 can be disposed on the substrate 200. In some embodiments, the passive components 70 may be an inductor, a condenser, a resistor, or the like.

Referring to FIG. 1, in some embodiments, an underfill material 135 is dispensed into gaps between the redistribution structure 150 and the substrate 200. The underfill material 135 surrounds the electrical connectors 184, the conductive pads 182, and each of the die packages 100. In some embodiments, the underfill material 135 may include, for example, an epoxy resin, a phenol resin, a urethane resin, a silicone resin, a polyimide resin, etc.

Figure 2:
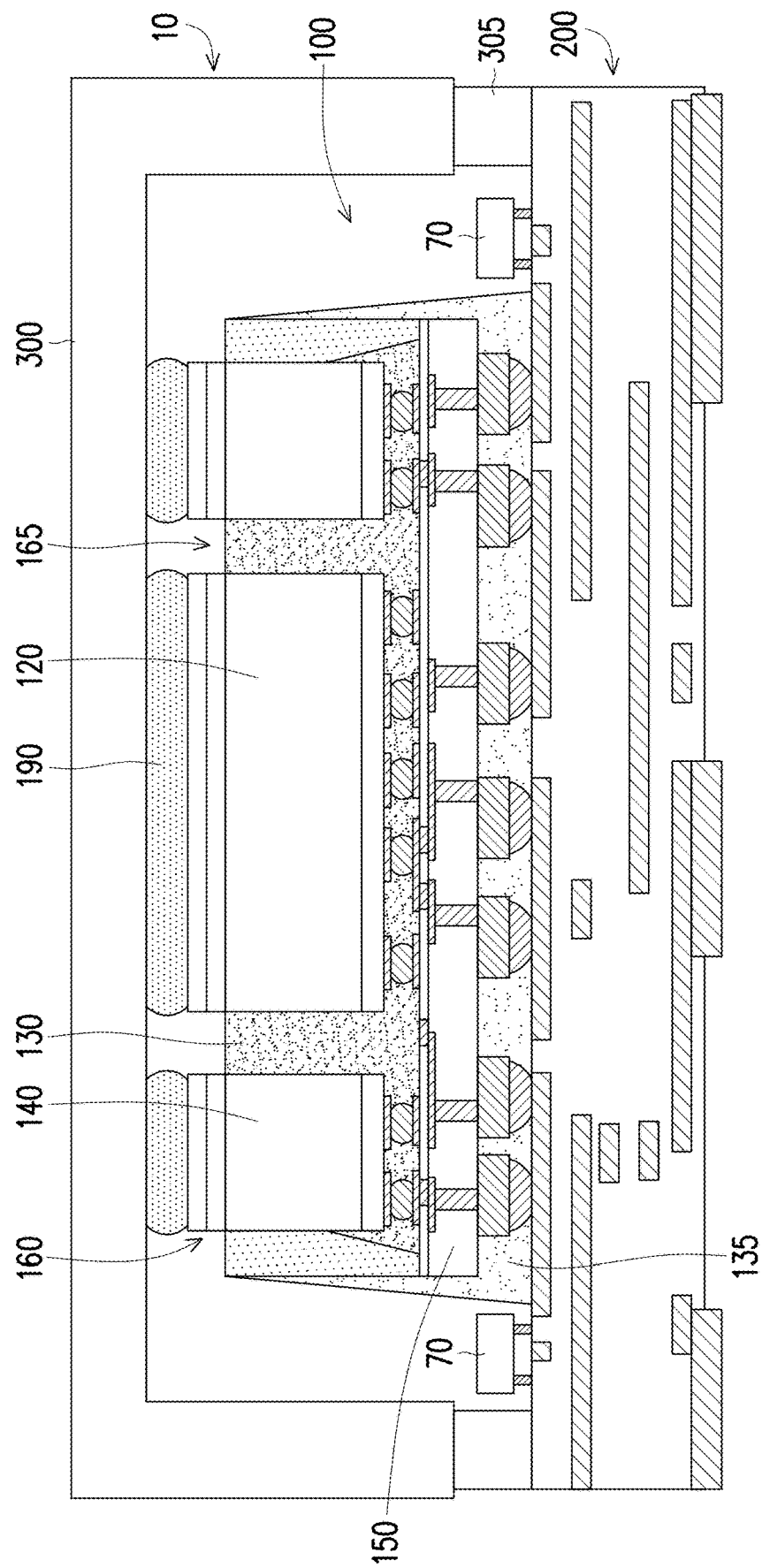
FIG. 2 illustrates a cross sectional view of a semiconductor package according to some exemplary embodiments of the present disclosure.

FIG. 2 illustrates a cross sectional view of a semiconductor package 10 according to some exemplary embodiments of the present disclosure. Referring again to FIG. 2, the semiconductor package 10 can further include a cover lid 300 mounted on the substrate 200 through an adhesive 305 disposed therebetween. The adhesive 305 may be firstly dispensed on a peripheral region of the substrate 200 where is adapted for attaching the cover lid 300 to the substrate 200. Pressure may be applied when installing the cover lid 300, and when the adhesive 305 is cured. The adhesive 305 can include a high transition temperature adhesive in some embodiments. Alternatively, other types of adhesives 305 may be used. In accordance with some embodiments of the disclosure, the material of the cover lid 300 may include steel and, in other embodiments, can be copper, stainless steel, the like, or a combination thereof.

As shown in FIG. 1 and FIG. 2, the cover lid 300 is attached to the heat dissipation films 160*a*, 160*b* by a thermal interface material (TIM) 190, such as silicon-based paste, grease, epoxy, or solder. As shown in FIG. 1 and FIG. 2, the TIM 190 is patterned and respectively disposed on the semiconductor devices 120, 140. In the present embodiment, the TIM 190 may facilitate the heat generated from the semiconductor devices 120, 140 being dissipated to the cover lid 300 and achieve sufficient contact between the cover lid 300 and the heat dissipation films 160*a*, 160*b* respectively disposed on the semiconductor devices 120, 140.

Figure 3:
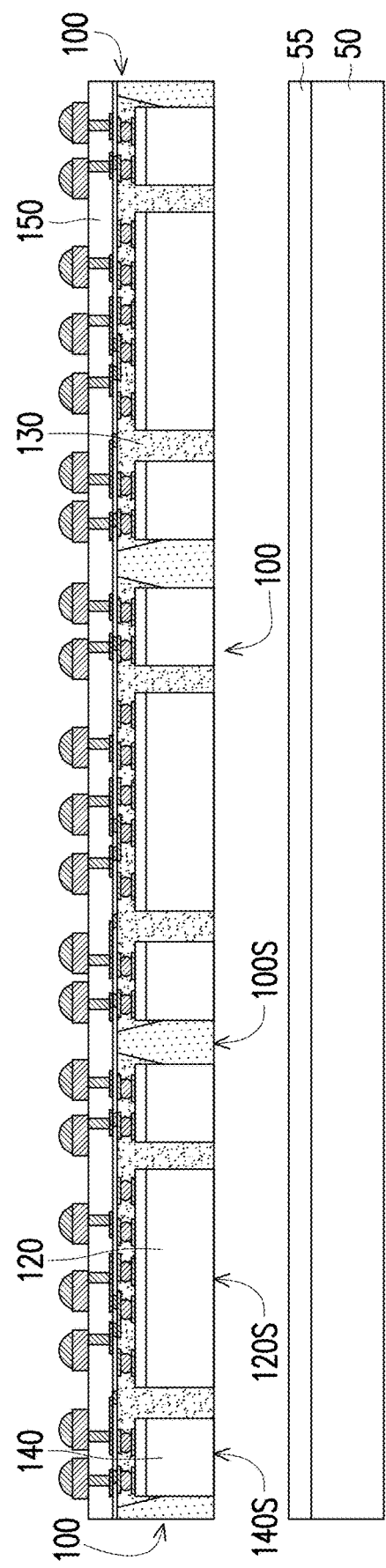
FIG. 3 to FIG. 8 illustrate cross sectional views of intermediate stages in a manufacturing of a semiconductor package according to some exemplary embodiments of the present disclosure.

FIG. 3 to FIG. 8 illustrate cross sectional views of intermediate stages in a manufacturing of a semiconductor package according to some exemplary embodiments of the present disclosure. With reference to FIG. 3, the plurality of die packages 100 respectively include the semiconductor devices 120, 140 and the redistribution structure 150 are provided. The semiconductor devices 120, 140 may be a plurality of semiconductor dies and are respectively disposed on the redistribution structure 150. As shown in FIG. 3, the die packages 100 are respectively detached from a carrier 50. The carrier 50 has a die attach film (DAF) 55 disposed for attaching the die packages 100 to a surface of the carrier 50. In some embodiments, the DAF 55 is an epoxy resin, a phenolic resin, an acryl rubber, a cerium oxide filler, or a combination thereof, which is carried out by a laminate method. However, any suitable alternative forming materials and methods can also be applied.

Figure 4:
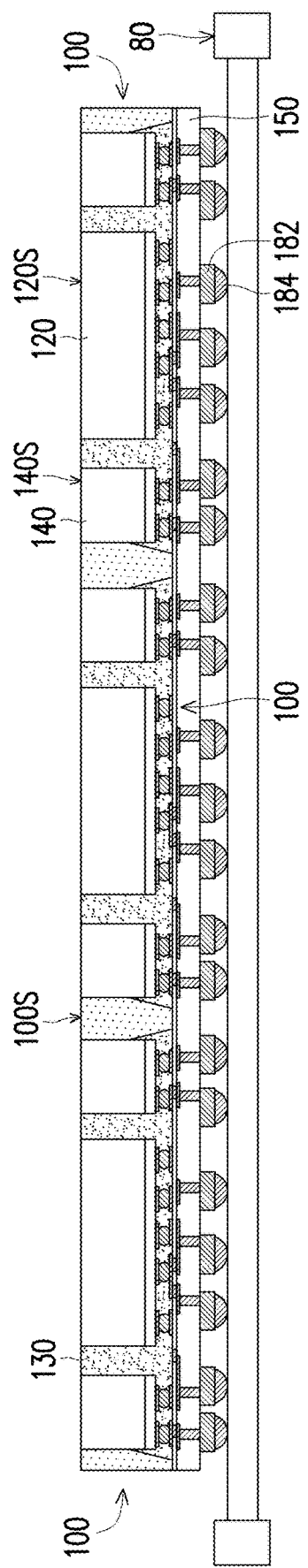

Referring to FIG. 3 and FIG. 4, the die packages 100 are respectively flipped and attached to a carrier 80 through the electrical connectors 184. In addition, the upper surfaces 100S of the die packages 100 (i.e., the debonding surfaces of the die package 100 from the carrier 50) are cleaned to remove the residual of the DAF 55. In some embodiments, the DAF 55 may be water soluble and can be removed with an aqueous solution. In some embodiments, referring to FIG. 4, a planarization process, including grinding or polishing, may be performed to both the upper surfaces 120S, 140S of the semiconductor devices 120, 140 and a top surface of the encapsulating material 130. Accordingly, the upper surfaces (backside surfaces) 120S, 140S of the semiconductor devices 120, 140 are coplanar (levelled) with the top surface of the encapsulating material 130.

Figure 5:
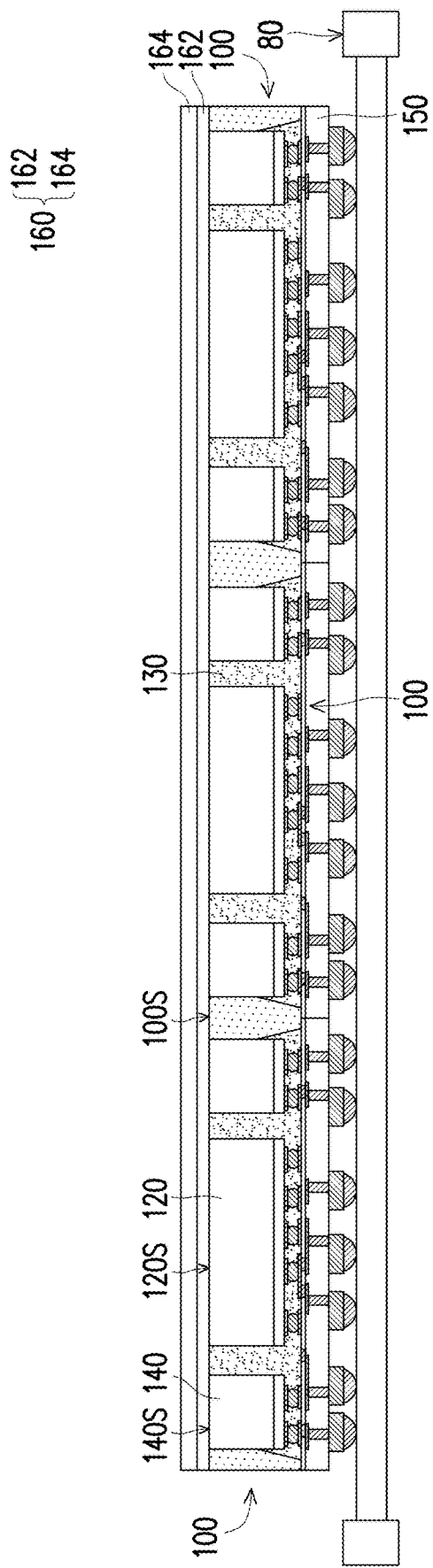

Referring to FIG. 5, a heat dissipation sheet 160 is disposed on the upper surface 100S of each of the die packages 100. In the present embodiment, the heat dissipation sheet 160 includes a first sheet layer 162 and a second sheet layer 164 sequentially deposited and stacked on the upper surfaces 100S of the die packages 100. In some embodiments, the heat dissipation sheet 160 may be a backside metal (BSM) structure. In certain embodiments, the first sheet layer 162 and the second sheet layer 164 may include metal materials such as aluminum (Al), titanium (Ti), titanium nitride (TiN), nickel (Ni), nickel vanadium (NiV), gold (Au), silver (Ag), copper (Cu), etc. In some embodiments, the first sheet layer 162 and the second sheet layer 164 may be deposited on the semiconductor devices 120, 140 and the encapsulating material 130 by a sputtering process, a printing process, an electro-chemical plating process, a chemical vapor deposition (CVD), an atomic layer deposition (ALD) or a physical vapor deposition (PVD). In some embodiments, thicknesses of the first sheet layer 162 and the second sheet layer 164 are substantially in a range from 0.3 microns to 3 microns, and an overall thickness of the heat dissipation sheet is substantially in a range from 0.5 micron to 5 microns.

In some other embodiments, the first sheet layer 162 and the second sheet layer 164 may include thermally conductive and electrically insulating material, such as an epoxy, like an epoxy mixed with a metal like silver or gold, a thermal grease, or a combination thereof. For example, the materials of the first sheet layer 162 and the second sheet layer 164 of the heat dissipation sheet 160 may include epoxy, resin, acrylic, silicone, an inorganic material such as a lightly cross-linked silicone polymer, one or more matrix polymers, a polymer with one or more thermally conductive fillers, other materials, or multiple layers or combinations thereof in some embodiments, as examples.

Figure 6:
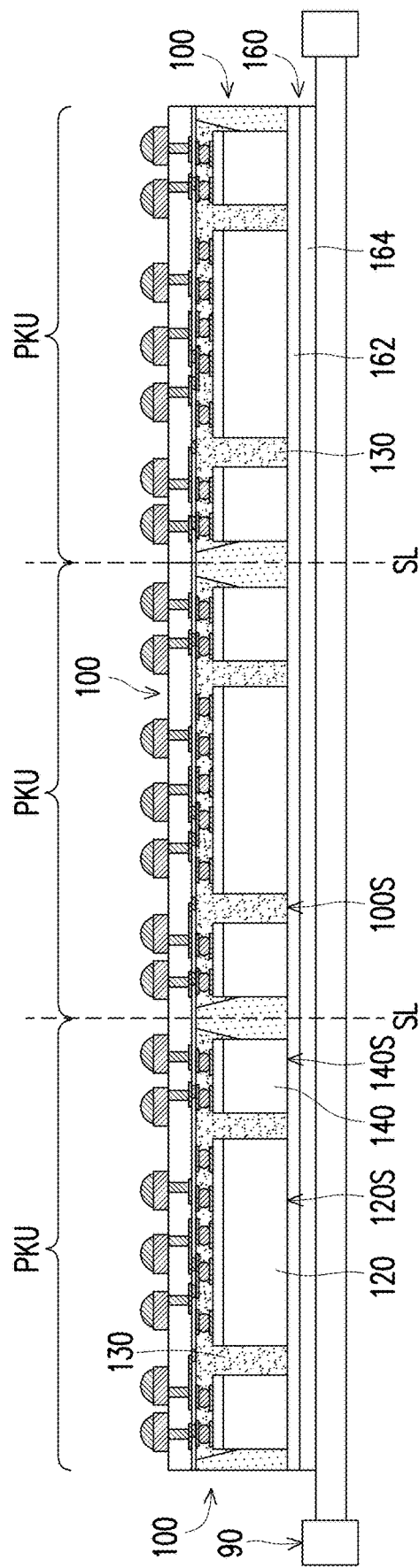

Referring to FIG. 5 and FIG. 6, the die packages 100 are detached from the carrier and the structure shown in of FIG. 5 is turned upside down or flipped and placed on a carrier 90, so that the carrier 90 directly contacts the heat dissipation sheet 160, including the first sheet layer 162 and the second sheet layer 164, disposed on the upper surfaces 100S of the die packages 100.

In accordance with some embodiments of the disclosure, referring to FIG. 6, the semiconductor devices 120 may be major semiconductor dies, while the semiconductor devices 140 may be tributary semiconductor dies. From FIG. 6, it can be viewed from packaging units PKU defined between a plurality of scribe lines SL, the major semiconductor dies 120 may be arranged on the redistribution structure 150 in central locations of the packaging units PKU, while the tributary semiconductor dies 140 are arranged aside the major semiconductor dies 120 and respectively spaced apart from the major semiconductor dies 120 through the encapsulating material 130 therebetween. In some embodiments, the tributary semiconductor dies 140 are arranged around or surround the major semiconductor dies 120. In the present amendment, the numbers and the layout designs of the semiconductor devices 120, 140 are not limited thereto. In some embodiments, the semiconductor devices 120 may have a surface area larger than that of the semiconductor devices 140 from a top view of the die packages 100. Moreover, in some embodiments, the semiconductor devices 120 and the semiconductor devices 140 may have different dimensions, including different surface areas and/or different thicknesses. In some embodiments, the semiconductor devices 120 may be logic dies, including a central processing unit (CPU) die, graphics processing unit (GPU) die, system-on-a-chip (SoC) die, a microcontroller, etc. In some embodiments, the semiconductor devices 120 can be power management dies, such as power management integrated circuit (PMIC) dies. In some embodiments, the semiconductor devices 140 may be memory dies, including dynamic random access memory (DRAM) dies, static random access memory (SRAM) dies or high bandwidth memory (HBM) dies.

Figure 7:
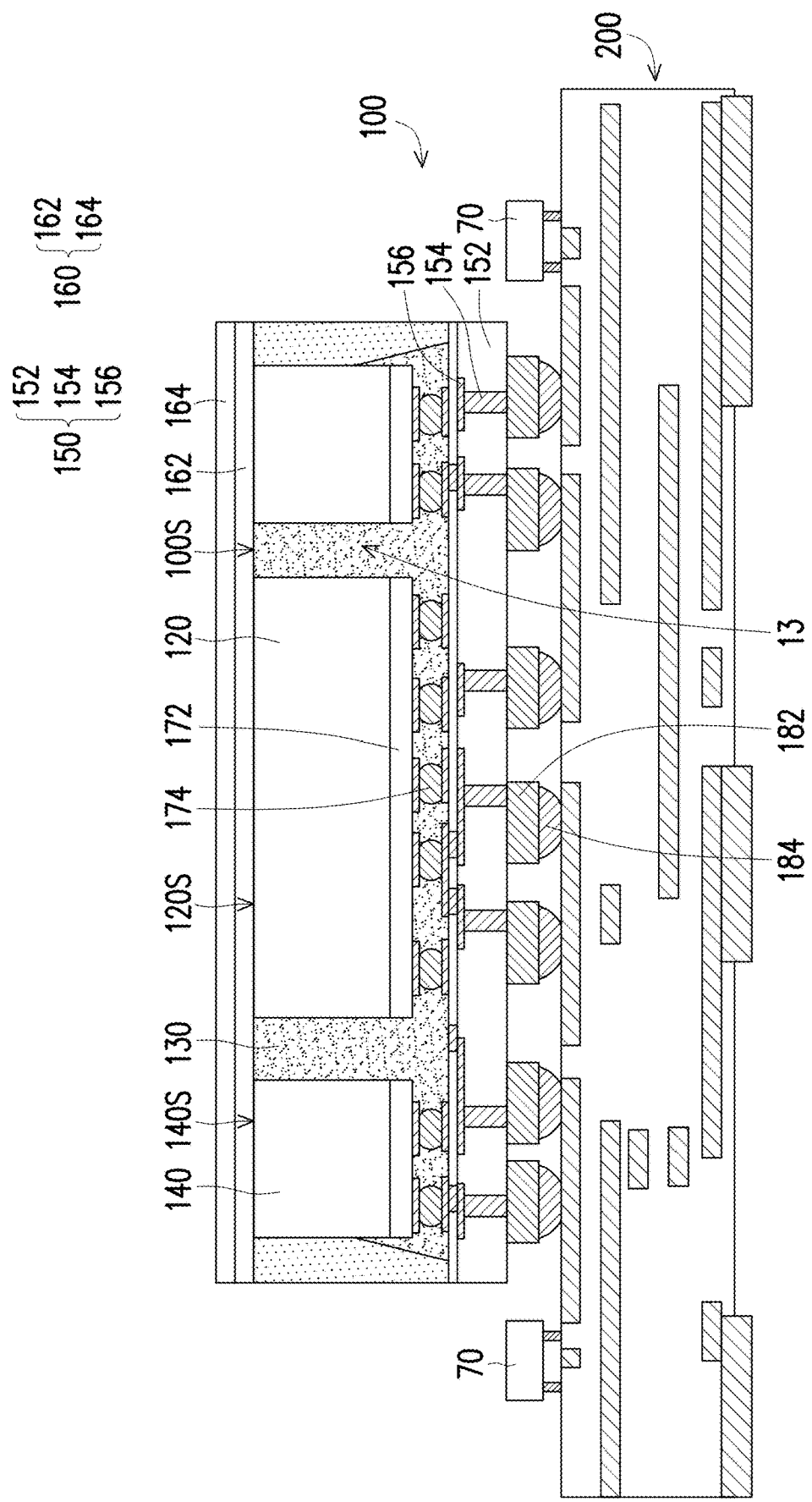

Referring to FIG. 6 and FIG. 7, the die packages 100 are scribed along the scribe lines SL and singulated into a plurality of the package units PKU. After the singulation process, the package units PKU respectively including die packages 100 are detached from the carrier 90, and the carrier 90 is subsequentially removed. In the subsequent process, the die packages 100 may be flipped and further mounted on a substrate 200 such as a circuit substrate or a packaging substrate, etc. Referring to FIG. 7, a single package unit PKU including a single die package 100 is picked, turned upside down, and disposed on the substrate 200 through connecting the electrical connectors 184 to the conductive traces 202 of the substrate 200. In the present embodiment, a plurality of the passive components may be also disposed the surface of the substrate 200 and surround the die package 100. In the present embodiment, the passive components 70 may be an inductor, a condenser, a resistor, or the like and electrically connected with the die package 100 through the conductive traces 202, the electrical connectors 184, and the conductive pads 182.

In accordance with some embodiments of the disclosure, referring FIG. 7, the die package 100 is placed on the substrate 200 and then a reflow process can be performed. In some embodiments, the die packages 100 are respectively picked and placed over a top surface of the substrate 200, and the electrical connectors 184 on a bottom surface of the die package 100 are aligned to and disposed on the conductive traces 202 of the substrate 200. The reflow process is performed as part of the bonding process between the electrical connector 184 on the bottom surface of the die package 100 and the substrate 200. In some embodiments, the reflow process includes performing a thermal heating process at a reflow temperature to electrical connectors 184, so that the electrical connectors 184 turns into a melted state or a semi-melted state to integrate and bond with the substrate 200. The reflow temperature of the electrical connectors 184 is required to be higher than a melting point of the composing materials of the electrical connectors 184. In some embodiments, the electrical connectors 184 are controlled-collapse-chip connection (C4) bumps, the reflow temperature ranges from 220° C. to 250° C. In some embodiments, the electrical connectors 184 are solder balls or lead-free solder balls, the reflow temperature ranges from 200° C. to 260° C. In accordance with some embodiments of the disclosure, during the thermal process such as reflow process, under the thermal impact, the substrate 200, the semiconductor devices (and the semiconductor devices 120, 140) becomes warped owing to the CTE mismatch.

Figure 8:
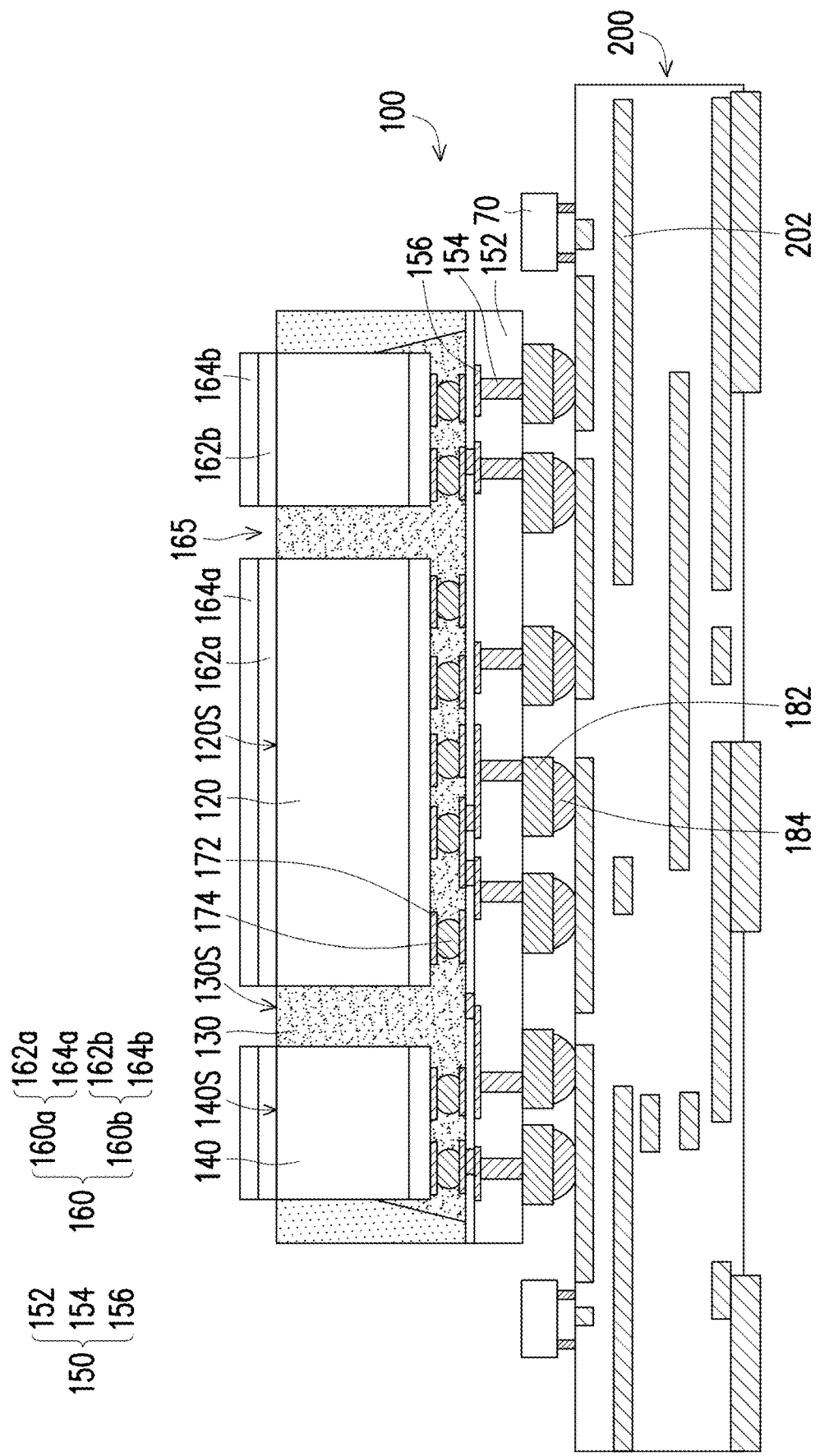

Referring to FIG. 8, a flux removal cleaning process is applied to the heat dissipation sheet 160 to selectively remove a portion of the heat dissipation sheet 160 covering the top surface 130S of the encapsulating material 130. In some embodiments, the flux removal cleaning process can include aqueous cleaning, plasma cleaning and/or other cleaning process. In some embodiments, the flux removal cleaning process may be performed with flux removal cleaners including, for example, a potassium hydroxide (KOH) solution, a sodium hydroxide (NaOH) solution, or a terahydrophthalic anhydride (TMMA) solution. In some embodiment, a concentration of the KOH solution is in a range substantially from 0.1 wt % to 35 wt %. In some embodiment, a concentration of the NaOH solution is in a range substantially from 0.2 wt % to 40 wt %.

Namely, the heat dissipation sheet 160 on the surface 100S of the die package 100 may be washed by the flux removal cleaners and partially removed. Referring to FIG. 7, in the present embodiment, the portions of the heat dissipation sheet 160 disposed on the upper surfaces 120S, 140S of the semiconductor devices 120, 140 have better adhesion than the rest portions of the heat dissipation sheet 160 disposed on a top surface 130S of the encapsulating material 130 due to difference in their surface composing materials. That is, the upper surfaces 120S, 140S of the semiconductor devices 120, 140 are formed by a silicon material or alloy materials thereof have better attachment than a top surface 130S of the encapsulating material 130 formed by a polymer material. Hence, through the flux removal cleaning process, the heat dissipation sheet 160 formed on the encapsulating material 130 can be selectively washed and removed to form the trenches 165 extending between each two of the semiconductor devices 120, 140, which expose the top surface 130S of the encapsulating material 130. Moreover, in each die package 100, the heat dissipation sheet 160 is singulated by the trenches 165 into the heat dissipation film 160a on the upper surface 120S of the semiconductor device 120 and the heat dissipation films 160b on the upper surfaces 140S of the semiconductor devices 140.

Referring to FIG. 8, the heat dissipation films 160a, 160b respectively include first heat dissipation layers 162a, 162b and second heat dissipation layers 164a, 164b respectively formed by different metal materials such as Al, Ti, TiN, Ni, NiV, Au, Ag, Cu, or the combinations thereof. Further, thicknesses of the first heat dissipation layers 162a, 162b and the second heat dissipation layers 164a, 164b are respectively in a range substantially from 0.05 micron to 3 microns. In some other embodiments, the thickness of the first heat dissipation layers 162a, 162b may be different from the second heat dissipation layers 164a, 164b. Moreover, overall thicknesses of the heat dissipation films 160a, 160b are respectively in a range substantially from 0.4 micron to 5 microns.

FIG. 9A illustrates a top view of a die package 100 according to some exemplary embodiments of the present disclosure. FIG. 9B illustrates a cross section view of the die package along an AA' line of FIG. 9A. Referring to FIG. 9A and FIG. 9B, the underfill material 135 may be dispensed into the gaps between the redistribution structure 150 and the substrate 200. Moreover, the underfill material 135 surrounds the electrical connectors 184, the conductive pads 182, and each of the die packages 100. In some embodiments, the underfill material 135 may include, for example, an epoxy resin, a phenol resin, a urethane resin, a silicone resin, a polyimide resin, etc. From the top view of the die package 100 as shown in FIG. 9A, the heat dissipation film 160a has a greater covering area comparing to the heat dissipation film 160b to cover the semiconductor device 120 having a greater surface area than the semiconductor devices 140.

FIG. 10A and FIG. 10B illustrate an enlarge view of a die package 100 according to some exemplary embodiments of the present disclosure. Referring to FIG. 10A and FIG. 10B, in some embodiments, the portions of the heat dissipation sheet 160 disposed on the encapsulating materials 130 are removed to expose the top surface 130S thereof. As the embodiment shown in FIG. 10B, the top surface 130S of the encapsulating material 130 is coplanar with the upper surfaces 140S of the semiconductor devices 140. In the present embodiment, a peripheral portion 160b2 of the heat dissipation film 160b may be existed between the top surface 130S of the encapsulating material 130 and peripheral edges of the center portion 160b1 of the heat dissipation film 160b. As shown in FIG. 10A and FIG. the peripheral portion 160b2 surrounds peripheral edges of the semiconductor device 140. Due to a stronger attachment force provided from an interface between the center portion 160b1 of the heat dissipation film 160b and the semiconductor device 140, the peripheral portion 160b2 surrounding and connected to the center portion 160b1 is remained on the top surface 130S of the encapsulating material 130 after the above-mentioned flux removal cleaning process. In the present embodiment, as shown in FIG. a thickness height H1 of the heat dissipation films 160a, 160b is equal to a distance H2 between top surfaces of the heat dissipation films 160a, 160b and the top surface 130S of the encapsulating material 130.

Figure 10C:
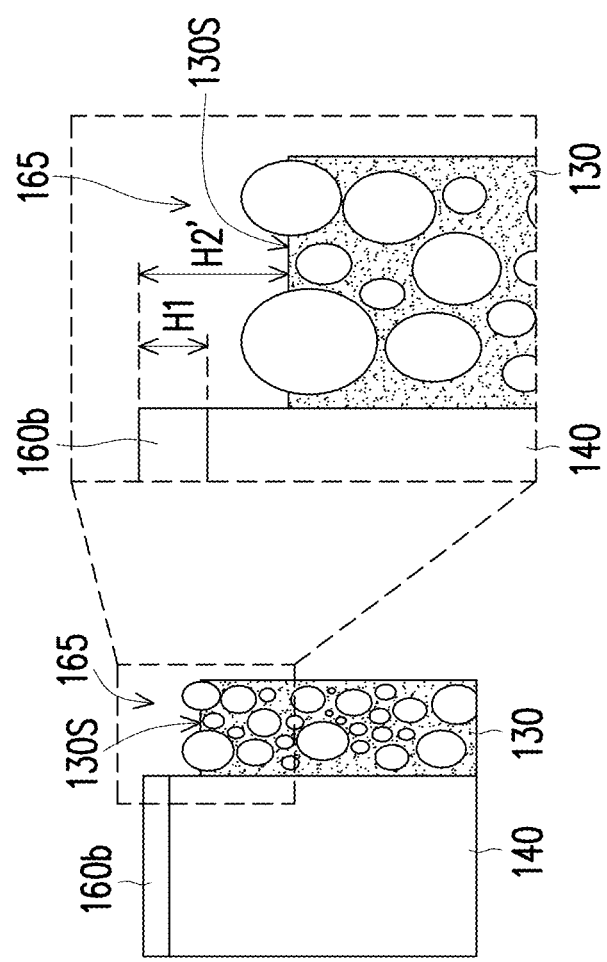
FIG. 10C illustrates an enlarge view of a die package according to some exemplary embodiments of the present disclosure.

FIG. 10C illustrates an enlarge view of a die package 100 according to some exemplary embodiments of the present disclosure. In some other embodiments, after performing the flux removal cleaning process, the portion of the heat dissipation film 160 on the encapsulating material 130 and a portion of the encapsulating material 130 are removed and washed away together to form the trenches 165 that surround the peripheral edges of the heat dissipation films 160a, 160b. Referring to FIG. 10C, a distance between H2' between the top surfaces of the heat dissipation films 160a, 160b and the top surface 130S of the encapsulating material 130 is greater than the thickness height H1 of the heat dissipation films 160a, 160b.

Figure 11:
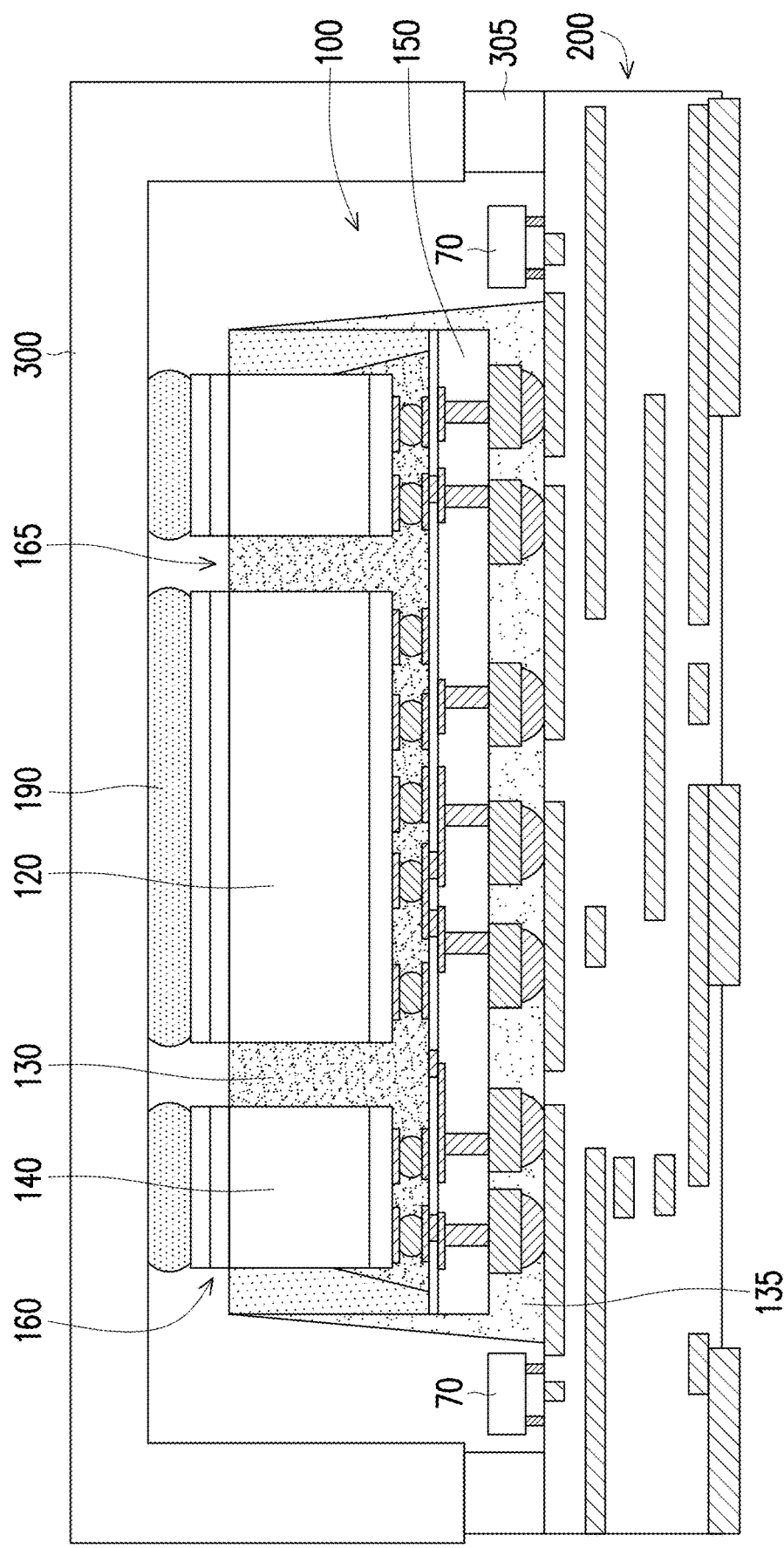
FIG. 11 illustrates a cross sectional view of an intermediate stage in a manufacturing of a semiconductor package according to some exemplary embodiments of the present disclosure.

FIG. 11 illustrates a cross sectional view of an intermediate stage in a manufacturing of a semiconductor package 10 according to some exemplary embodiments of the present disclosure. Referring to FIG. 9B and FIG. 11, the cover lid 300 is further mounted on the substrate 200 through the adhesive 305 disposed therebetween. In the present embodiment, the package formed in the step of the manufacturing process shown in FIG. 9B is firstly placed into a heat sink (not shown). Subsequently, the adhesive 305 may be dispensed on the peripheral region of the substrate 200 where the cover lid 300 is attached for attaching the cover lid 300 to the substrate 200. Pressure can be applied when installing the cover lid 300, and the adhesive 305 is cured through a curing process. Moreover, the cover lid 300 is also attached to the heat dissipation films 160a, 160b respectively on the semiconductor devices 120, 140 by the TIM 190 disposed therebetween. As shown in FIG. 9B and FIG. 11, the TIM 190 is disposed above the semiconductor devices 120, 140 respectively corresponding to the patterns of the configuration of the heat dissipation films 160a, 160b. In the present embodiment, the TIM 190 disposed between the cover lid 300 and the heat dissipation films 160a, 160b is divided into several different portions respectively disposed above the semiconductor devices 120, 140.

In the present embodiments, the TIM 190 in the embodiment shown in FIG. 11 is not a continuous structure disposed between the cover lid 300 and the die package 100 and not covering the entire upper surface of the die package 100. Hence, an internal stress of the TIM 190 can be reduced and released. In addition, the joint between the cover lid 300 and the heat dissipation films 160a, 160b can be enhanced to improve performance reliability of dissipating the heat generated from the semiconductor devices 120, 140 through the heat dissipation films 160a, 160b and the cover lid 300.

Figure 12:
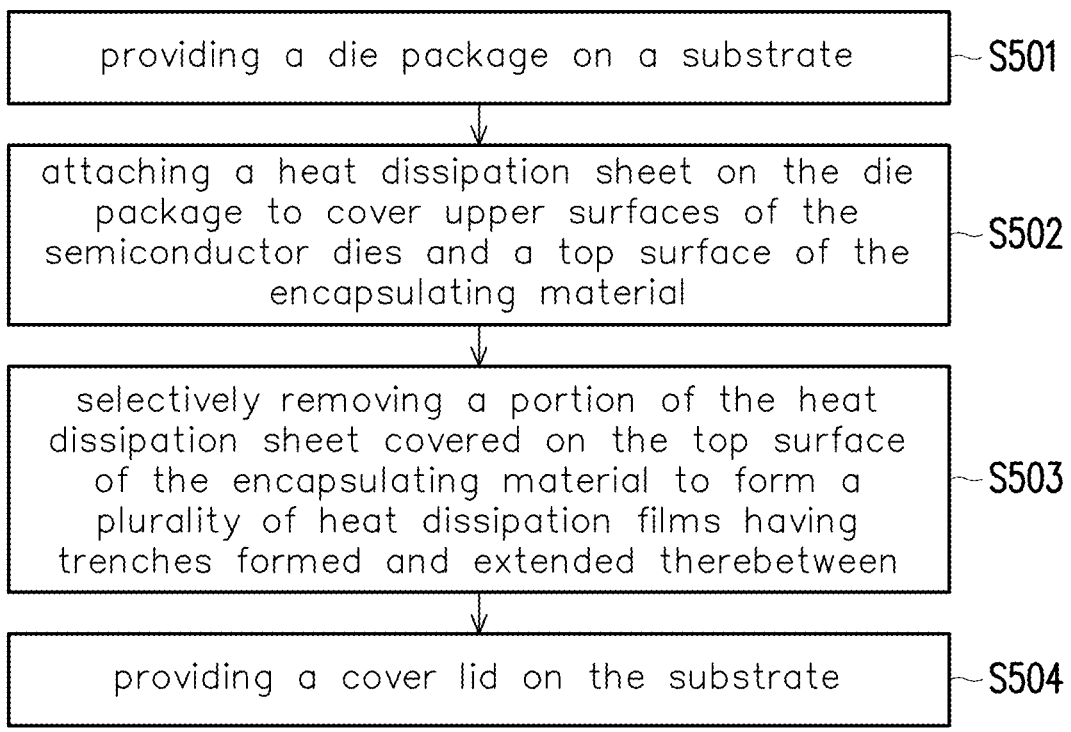
FIG. 12 illustrates a block diagram of a manufacturing process of a semiconductor package according to some exemplary embodiments of the present disclosure.

FIG. 12 illustrates a block diagram of a manufacturing process of a semiconductor package according to some exemplary embodiments of the present disclosure. With now reference to FIG. 7, FIG. 8 and FIG. 11, as described above, the manufacturing process of the semiconductor package 10 following a sequential order shown in FIG. 12. In the block diagram in FIG. 12, the step 501 is providing the die package 100 on the substrate 200 as shown in FIG. 7. Referring to FIG. 7 and FIG. 12, in the step S502, the heat dissipation sheet 160, which can be a backside metal film, is attached on the die package 100 to cover both the upper surfaces 120S, 140S of the semiconductor dies 120, 140 and the top surface of the encapsulating material 130. Referring to FIG. 8 and FIG. 12, in the step S503, the portion of the heat dissipation sheet 160 covered on the top surface 130S of the encapsulating material 130 is removed to form the plurality of heat dissipation films 160a, 160b having the trenches 165 existed and extended therebetween. Further, referring to FIG. 11 and FIG. 12, in the step S504, the cover lid 300 is provided on the substrate 200 and attached to substrate 200 through the adhesive 305.

In the present embodiments, a warpage of the die package 100 or the overall semiconductor package 10 generated during the manufacturing processes such as heat reflow processes. Through the above configurations of the heat dissipation films 160a, 160b respectively above the semiconductor devices 120, 140 with the trenches 165 extended therebetween, the delamination between the heat dissipations films 160a, 160b due to the warpage can be alleviated. Moreover, the internal stress of TIM 190 disposed between the cover lid 300 and the heat dissipation films 160, 160b during the manufacturing processes of the semiconductor package 10 caused by its warpage can be also reduced or released.

Based on the above descriptions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a redistribution structure, a plurality of semiconductor devices, and a plurality of heat dissipation films. The plurality of semiconductor devices are mounted on the redistribution structure. The heat dissipation films are respectively disposed on and jointly covering upper surfaces of the plurality of semiconductor devices. A plurality of trenches are respectively extended between each two of the heat dissipation films and extended between each two of the semiconductor devices.

In accordance with some embodiments of the disclosure, a semiconductor package includes a substrate, a die package, a plurality of heat dissipation films, and a cover lid. The die package is disposed on the substrate. The die package includes a plurality of semiconductor dies. A plurality of heat dissipation films are respectively disposed on and jointly cover upper surfaces of the semiconductor dies. A plurality of trenches are extended between each two of the heat dissipation films and extended between each two of the heat dissipation films. A cover lid is disposed on the substrate and in contact with the heat dissipation films.

In accordance with some embodiments of the disclosure, a manufacturing method of a semiconductor package includes the following steps. A die package on a redistribution structure is provided. Th die package includes a plurality of semiconductor dies encapsulated by an encapsulating material. The upper surfaces of the semiconductor dies are exposed from the encapsulating material. A heat dissipation sheet is attached on the die packages to cover the upper surfaces of the semiconductor dies and a top surface of the encapsulating material. A portion of the heat dissipation sheet covered on the top surface of the encapsulating material is selectively removed to from a plurality of heat dissipation films having a plurality of trenches formed and extended therebetween. A cover lid is provided on the substrate. The cover lid is in contact with the plurality of heat dissipation films.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a redistribution structure;
   a plurality of semiconductor devices mounted on the redistribution structure; and
   a plurality of heat dissipation films respectively disposed on and jointly covering upper surfaces of the plurality of semiconductor devices, wherein a plurality of trenches are respectively extended between each two of the plurality of heat dissipation films; and
   an encapsulating material disposed on the redistribution structure and encapsulating the plurality of semiconductor devices, wherein a first surface of the encapsulating material faces the redistribution structure, and a second surface opposite to the first surface of the encapsulating material is exposed from the plurality of trenches.

2. The semiconductor package as claimed in claim 1, wherein the second surface of the encapsulating material is coplanar with the upper surfaces of the plurality of semiconductor devices, and a portion of the encapsulating material close to peripheral edges of the plurality of semiconductor devices is covered by the plurality of heat dissipation films.

3. The semiconductor package as claimed in claim 1, wherein the second surface of the encapsulating material is lower than the upper surfaces of the plurality of semiconductor devices.

4. The semiconductor package as claimed in claim 1, further comprising a substrate, wherein the redistribution structure is mounted on the substrate through a plurality of electrical connectors.

5. The semiconductor package as claimed in claim 4, further comprising a cover lid disposed on the substrate and in contact with the plurality of heat dissipation films.

6. The semiconductor package as claimed in claim 5, further comprising a thermal interface material disposed between the cover lid and the plurality of heat dissipation films.

7. The semiconductor package as claimed in claim 1, wherein each of the plurality of heat dissipation films comprises a first heat dissipation layer and a second heat dissipation layer alternatively and vertically stacked on the upper surfaces of the plurality of semiconductor devices.

8. The semiconductor package as claimed in claim 1, wherein the redistribution structure continuously extends below and between the plurality of semiconductor devices.

9. A semiconductor package, comprising:
   a substrate;
   a die package disposed on the substrate, wherein the die package comprising a plurality of semiconductor dies and an encapsulating material surrounding the plurality of semiconductor dies and disposed between the plurality of semiconductor dies; and
   a plurality of heat dissipation films respectively disposed on and jointly covering upper surfaces of the plurality of semiconductor dies, wherein a plurality of trenches are respectively extended between each two of the plurality of the heat dissipation films; and
   a cover lid disposed on the substrate and in contact with the plurality of heat dissipation films, wherein the upper surfaces of the plurality of semiconductor dies are exposed from the encapsulating material, and a top surface of the encapsulating material faces the cover lid and is exposed from the plurality of trenches.

10. The semiconductor package as claimed in claim 9, wherein the top surface of the encapsulating material is coplanar with the upper surface of the plurality of semiconductor dies, and a portion of the encapsulating material close to peripheral edges of the plurality of semiconductor devices is covered by the plurality of heat dissipation films.

11. The semiconductor package as claimed in claim 9, wherein the die package further comprises a redistribution structure where the plurality of semiconductor dies are disposed, and the redistribution structure is mounted on the substrate through a plurality of electrical connectors.

12. The semiconductor package as claimed in claim 9, wherein each of the plurality of heat dissipation films comprises at least one first heat dissipation layer and at least one second heat dissipation layer alternatively stacked on the upper surfaces of the plurality of semiconductor dies along a thickness direction thereof.

13. The semiconductor package as claimed in claim 12, wherein a thickness of the at least one first heat dissipation layer is different from a thickness of the at least one second heat dissipation layer.

14. The semiconductor package as claimed in claim 9, wherein covering areas of the plurality of heat dissipation films on the upper surfaces of the plurality of semiconductor dies are different from each other.

15. The semiconductor package as claimed in claim 9, wherein the encapsulating material is continuously disposed between the plurality of semiconductor dies and between the substrate and the plurality of semiconductor dies.

16. A manufacturing method of a semiconductor package, comprising:
 providing a die package on a substrate, wherein the die package comprises a plurality of semiconductor dies encapsulated by an encapsulating material, the encapsulating material surrounds the plurality of semiconductor die and is disposed between the plurality of semiconductor dies, and upper surfaces of the plurality of semiconductor dies are exposed from the encapsulating material;
 attaching a heat dissipation sheet on the die package to cover the upper surfaces of the plurality of semiconductor dies and a top surface of the encapsulating material; and
 selectively removing a portion of the heat dissipation sheet covered on the top surface of the encapsulating material to form a plurality of heat dissipation films having a plurality of trenches formed and extended therebetween, the heat dissipation films respectively disposed on and jointly covering the upper surfaces of the plurality of semiconductor dies; and
 providing a cover lid on the substrate, wherein the cover lid is in contact with the plurality of heat dissipation films, and a top surface of the encapsulating material faces the cover lid and is exposed from the plurality of trenches.

17. The manufacturing method of the semiconductor package as claimed in claim 16, wherein providing the die package on the substrate further comprises:
 mounting the die package on the substrate through a plurality of electrical connectors.

18. The manufacturing method of the semiconductor package as claimed in claim 16, wherein the plurality of heat dissipation films cover merely the upper surfaces of the plurality of semiconductor dies without covering the top surface of the encapsulating material.

19. The manufacturing method of the semiconductor package as claimed in claim 16, wherein providing the die package on the substrate further comprises:
 performing a planarization process on the encapsulating material and the plurality of the semiconductor dies, such that the top surface of the encapsulating material is coplanar with the upper surfaces of the plurality of semiconductor dies.

20. The manufacturing method of the semiconductor package as claimed in claim 16, wherein the step of selectively removing the portion of the heat dissipation sheet covered on the top surface of the encapsulating material is performed by a flux removal cleaning process.

* * * * *